United States Patent
Koh et al.

(12)
(10) Patent No.: US 6,258,663 B1
(45) Date of Patent: Jul. 10, 2001

(54) METHOD FOR FORMING STORAGE NODE

(75) Inventors: Chao Ming Koh, Hsinchu; Jia Ching Tung, Kaoshung, both of (TW)

(73) Assignee: Vanguard International Semiconductor Corporation, Hsin Chu (TW)

(*) Notice: Subject to any disclaimer, the term of this patent is extended or adjusted under 35 U.S.C. 154(b) by 0 days.

(21) Appl. No.: 09/071,309

(22) Filed: May 1, 1998

(51) Int. Cl.[7] .................. H01L 21/8242; H01L 21/20; H01L 21/4763

(52) U.S. Cl. ................ 438/254; 438/397; 438/638

(58) Field of Search .................. 438/253, 254, 438/397, 638

(56) References Cited

U.S. PATENT DOCUMENTS

| | | | |
|---|---|---|---|
| 5,583,368 | * 12/1996 | Kenney ............................ | 257/621 |
| 5,595,929 | * 1/1997 | Tseng ............................... | 438/254 |
| 5,597,755 | * 1/1997 | Ajika et al. ..................... | 439/396 |
| 5,780,334 | * 7/1998 | Lim et al. ....................... | 438/239 |
| 5,827,766 | * 10/1998 | Lou ................................ | 438/253 |
| 5,856,220 | * 1/1999 | Wang et al. .................... | 438/254 |

* cited by examiner

Primary Examiner—Olik Chaudhuri
Assistant Examiner—Howard Weiss
(74) Attorney, Agent, or Firm—Tung & Associates

(57) ABSTRACT

The present invention provides a storage node for a semiconductor device, and particularly for a DRAM cell in which a simplified and improved process is provided when compared to the conventional methods. The process involves the deposition of a single oxide layer which has a thickness substantially the same as the height of the storage node to be built, and then sequentially forming a node contact window and a node tub window in the oxide layer followed by a single deposition of a polysilicon material to form the node contact and the crown-shaped storage node simultaneously.

13 Claims, 2 Drawing Sheets

METHOD FOR FORMING STORAGE NODE

FIELD OF THE INVENTION

The present invention generally relates to a method for forming storage node and more particularly, relates to a method for forming storage node used in a dynamic random access memory (DRAM) cell by first depositing a thick insulating layer on a semi-conducting substrate and then sequentially forming a node contact opening and a node tub opening in the insulating layer such that only a single polysilicon deposition is required to form the node contact and the storage node without the need of a nitride etch-stop.

BACKGROUND OF THE INVENTION

Dynamic random access memory cells have been widely used in modern semiconductor devices. The cells have been named as dynamic because they can retain information only for a limited time and must be read and refreshed periodically. This is in contrast to a static random access memory cell which does not require periodic refresh signals in order to retain stored data. In a typical DRAM cell, the structure includes a transistor and a storage node (or storage capacitor). When DRAM cells were first developed, planar type storage capacitors which occupy large wafer surface areas are used. As the circuit density increases in modern semiconductor devices where smaller chips are being made and are being packed with ever-increasing number of circuits, the specific capacitance of a storage capacitor must be increased in order to meet such demands.

Different approaches have been used in achieving higher capacitance in the storage node while limiting usage of wafer real estate. For instance, one solution is to store charges vertically in a trench which requires a deep trench formation and encounters significant processing difficulties. The second solution is to build a stacked capacitor on top of the transistor which allows a smaller cell to be built without losing storage capacity. The solution of using a stacked capacitor has become a more accepted and popular approach in the semiconductor fabrication industries.

In modem DRAM cells, small dimension and high capacitance value per unit area are therefore desirable characteristics for achieving high charge storage capacity. A DRAM storage node is normally formed by at least two layers of semi-conducting material and one layer of a dielectric material. For example, a widely used DRAM storage node utilizes a thin oxide layer sandwiched between two polysilicon layers to produce a high capacitance node cell. The node can be built by stacking over the bit line on the surface of a silicon substrate. The effective capacitance of a stacked cell is increased over that of a conventional planar cell due to its increased surface area.

A typical 16-Mb DRAM cell 10 having a stacked storage node 20 built on top is shown in FIG. 1. The DRAM cell 10 can be formed in the following manner. First, standard CMOS fabrication steps can be used to form the transistors and the gate oxide layer. To form the word lines 12, a first polysilicon layer of approximately 2,500 Å thick is deposited and then doped with phosphorous. A thick layer of insulating material 16 such as TEOS (tetraethoxy silicate) oxide of approximately 3,000 Å is then deposited on top of the first polysilicon layer. By using standard photomasking processes, the two layers are etched by a plasma etching technique as a stack. After LDD implants are made in the silicon substrate, oxide spacers are formed on the polysilicon gate structure by depositing a thick layer of TEOS oxide of approximately 2,000 Å and then etched in a plasma process. Gates 12 and 14 are thus formed and covered by a thick insulating layer 16 of oxide. A source and drain mask is then applied for an ion implantation process to form the source and drain regions in the silicon substrate.

In the next fabrication step, photomasking is used to form window openings for the cell contact and plasma etching is used to remove any native oxide layer on the silicon substrate. A second polysilicon layer 22 of approximately 3,500 Å is deposited and patterned by a photomask to form the lower electrode of the storage node 20. A dielectric layer 24 of a composite film of oxidenitride-oxide (ONO) is then deposited as the dielectric layer for the storage node. The total thickness of the ONO composite film is approximately 70 Å. The ONO composite film can be formed by using a thin layer of native oxide as the first oxide layer, depositing a thin nitride layer on top and then oxidizing the nitride layer to grow a top oxide layer. To complete the fabrication of the storage node, a third polysilicon layer 24 of approximately 2,000 Å thick is deposited on top of the dielectric layer and then doped and patterned by a photomask to form an upper electrode. After the formation of the stacked capacitor, peripheral devices can be formed by masking and ion implantation, followed by the formation of a bit line 28 of a polysilicon/metal silicide material. A thick insulating layer 32 of BPSG or SOG is then deposited over the capacitor and reflowed to smooth out the topography and to reduce the step height. Other back-end-processes such as metalization to form metal lines 34 are used to complete the fabrication of the memory device 10.

The stacked capacitor 10 shown in FIG. 1 has been successfully used in 16 Mb DRAM devices. However, as device density increases in ULSI devices and beyond, the planar surface required for building the conventional stacked capacitors becomes excessive and can not be tolerated. Furthermore, the topography of the device formed in FIG. 1 requires a difficult planarization process to be performed on the DRAM device. For instance, a low cost and reliable method of chemical mechanical polishing (CMP) can not be used.

It is therefore an object of the present invention to provide a method for forming DRAM storage node that does not have the drawbacks or shortcomings of the prior art methods for forming storage node.

It is another object of the present invention to provide a method for forming DRAM storage node which only requires a deposit of a single layer of insulating material on a pre-processed semi-conducting substrate for forming the node.

It is a further object of the present invention to provide a method for forming DRAM storage node that can be readily adapted in ultra-high density semiconductor devices.

It is another further object of the present invention to provide a method for forming DRAM storage node by dry etching a node contact opening and a node tub opening sequentially in an insulating layer deposited on the surface of a pre-processed semi-conducting wafer.

It is yet another object of the present invention to provide a method for forming DRAM storage node by the sequential forming of a small node contact opening and a large node tub opening for the deposition of a polysilicon material as the lower electrode of the node.

It is still another object of the present invention to provide a method for forming DRAM storage node by the sequential formation of a large node tub opening and a small node contact opening in an insulating layer for depositing a polysilicon node material in forming the lower electrode.

It is still another further object of the present invention to provide a DRAM storage node that is formed by a crown-shaped upper portion and a column-shaped lower portion by a polysilicon material in a medium of an insulating material encasing the storage node.

SUMMARY OF THE INVENTION

In accordance with the present invention, a method for forming storage node, and specifically for DRAM storage node is provided. The method is simplified and improved over conventional methods in that only a single insulating layer is deposited on a semi-conducting substrate and a single polysilicon layer is deposited into a node contact opening and a node tub opening for forming an upper and a lower portion of the storage node simultaneously.

In a preferred embodiment, a method for forming DRAM storage node can be carried out by first providing a pre-processed semiconductor wafer which has an oxide layer deposited on top and having a thickness substantially the same as the height of the storage node to be built, then forming a node contact opening of a first diameter by a first mask and a first etching process to expose the semiconductor substrate, then forming a node tub opening of a second diameter by a second mask and a second etching process to a depth smaller than the thickness of the oxide layer, wherein the second diameter is larger than the first diameter, and depositing and etching back polysilicon and dielectric layers to form the storage node.

The present invention is further directed to a storage node for a semiconductor structure that has a semi-conducting substrate, a column-shaped lower portion of the storage node of a semi-conducting material contacting the semi-conducting substrate, a crown-shaped upper portion of the storage node formed of a semi-conducting material that is in intimate contact and electrical communication with the lower portion of the node, a dielectric layer and a second semiconducting layer deposited on top of the upper portion forming the capacitor dielectric and the cell plate, and a medium of an insulating material encasing the storage node such that it is insulated from other active devices on the semiconducting substrate, the medium does not have a silicon nitride layer contained therein.

In an alternate embodiment, the present invention is directed to a method of forming a storage node for a semiconductor structure which can be carried out by first providing a front-end processed semiconductor wafer that has active regions, word lines and bit lines formed on top, then depositing an oxide layer to a thickness substantially the same as the height of the storage node to be built, then forming a node tub opening of a first diameter by a first mask and a first etching process to a depth smaller than the total thickness of the oxide layer, then forming a node contact opening of a second diameter by a second mask and a second etching process to expose the semiconductor wafer, the second diameter is smaller than the first diameter, and then depositing polysilicon and dielectric layers to form the storage node.

BRIEF DESCRIPTION OF THE DRAWINGS

These and other objects, features and advantages of the present invention will become apparent from the following detailed description and the appended drawings in which.

DETAILED DESCRIPTION OF THE PREFERRED AND ALTERNATE EMBODIMENTS

The present invention provides a method for making a storage node for a semiconductor device, and particularly for a DRAM device. The method is simplified and improved from the conventional methods. The method requires a single deposition of a thick oxide layer which is then sequentially etched for a node contact opening and a node tub opening and then deposited by a single polysilicon layer to form the node contact and the crown-shaped storage node.

Figure 1:
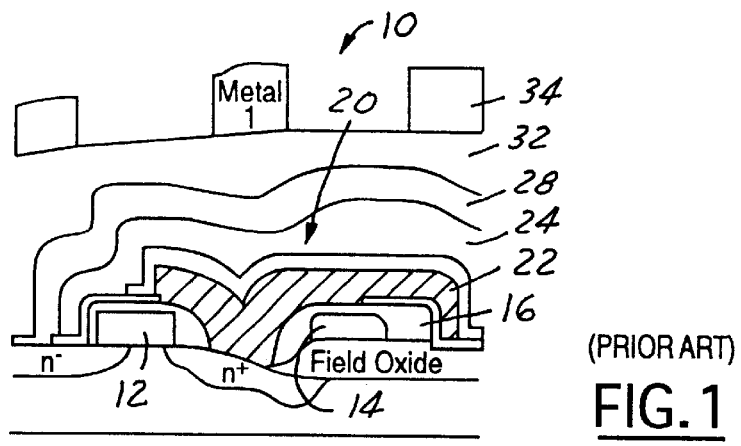
FIG. 1 is an enlarged, cross-sectional view of a conventional DRAM stacked capacitor.
Figure 2:
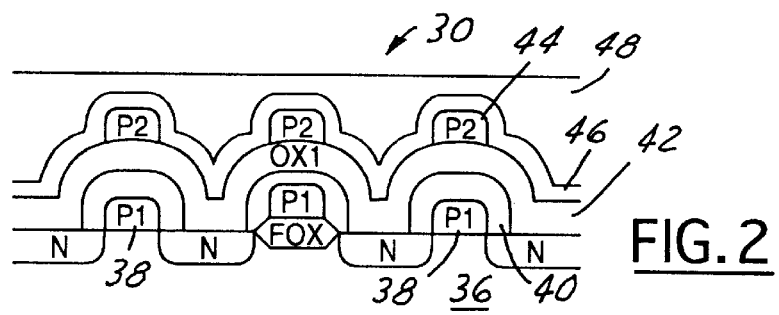
FIG. 2 is an enlarged, cross-sectional view of the present invention device having word lines and bit lines built on a semi-conducting substrate.

Referring initially to FIG. 2, wherein a present invention semiconductor structure 30 is shown. The front-end processes for preparing the semiconductor structure 30 is similar to that used in processing conventional advanced CMOS devices which includes the steps of forming source/drain junctions. From FIG. 2, it is seen that a polysilicon layer (not shown) is first deposited on the semi-conducting substrate 36 and then formed into word lines 38. After an insulating layer 40 is deposited and formed to insulate the word lines (or gates) 38, an oxide layer (OX-1) 42 is first deposited and then polysilicon bit lines 44 are deposited and formed on top. The bit lines 44 are normally formed by a doped polysilicon for improved electrical conductance. A dielectric layer (OX-2) 46 is then deposited to insulate the gate lines 44. The dielectric layer 46 also functions as a diffusion buffer layer between the bit lines 44 and the oxide layer (OX-3) 48 subsequently deposited on top. The OX-3 layer is a thick dielectric layer which can be planarized to provide a low-topography surface and further, the dielectric layer has a high wet etch rate than the oxide layer. The dielectric layer 48 can be formed of a BPSG material or a PE oxide material.

Figure 3:
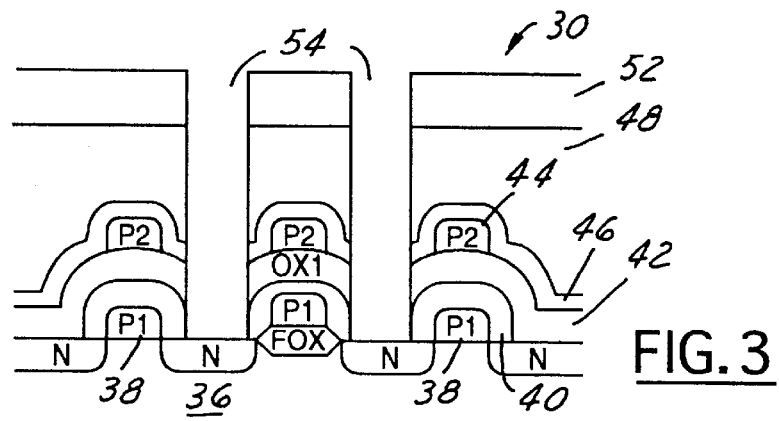
FIG. 3 is an enlarged, cross-sectional view of the present invention device of FIG. 2 having a thick oxide layer, a mask layer deposited on top and a node contact opening formed.

In the next processing step, as shown in FIG. 3, a mask (mask-1) layer 52 is first formed and then patterned with node contact openings 54. An oxide etch which etches through OX-3 layer 48, OX-2 layer 46 and OX-1 layer 42 is then conducted to open the contact opening and stops at the semi-conducting substrate 36. The node opening for the contact of the DRAM cell is therefore formed, The mask-2 layer 52 is subsequently stripped by oxygen ashing and wet etching methods. It should be noted that while the OX-1 layer 42 and the OX-2 layer 46 are approximately between 2000~6000 Å thick, the OX-3 layer 48 is substantially thicker, i.e., in the range between 4000~20000 Å thick. The thickness of the OX-3 layer 48 is predetermined such that there is sufficient room for forming a crown-shaped storage node in the layer.

Figure 4:
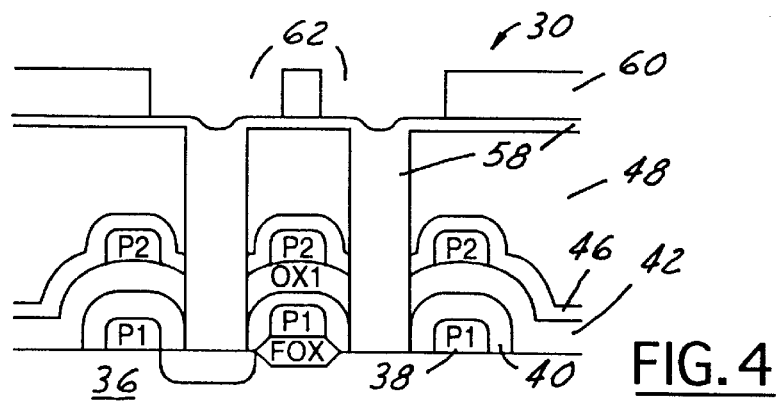
FIG. 4 is an enlarged, cross-sectional view of the present invention device of FIG. 3 having a resist layer deposited into the node contact opening and a second mask applied to define the node tub opening.

A spin-on type resist material 58 is optionally deposited which fills up the contact opening 54. The spin-on coating resist material is not photo sensitive and thus can be coated at a thickness as thin as 1000 Å. However, it can also be readily used to fill up the node contact opening as that shown in FIG. 4. It has been found that instead of using the spin-on coating resist material, an anti-reflective coating material can be used in its place while serving the additional function of an anti-reflective coating. A second mask 60 (mask-2) is then formed and patterned to show node tub openings 62.

Figure 5:
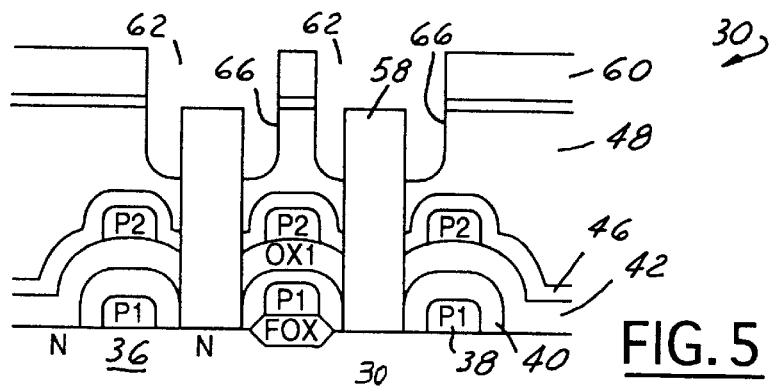
FIG. 5 is an enlarged, cross-sectional view of the present invention device of FIG. 4 having the node tub opening formed by a dry etch process.

FIG. 5 illustrates the next processing step for etching the resist-1 layer 58 and for etching the OX-2 oxide layer. As shown in FIG. 5, the resist-1 layer 58 is first etched in a dry etching method by an etchant gas which has high selectivity towards the resist-1 layer 58 but low selectivity towards oxide. For instance, such etchant gas includes $CHF_3$, $CF_4$ and Av. The etching process removes the resist-1 layer 58 in the mask-2 layer 60 opened region (or windows) above the OX-3 layer 48. An oxide etch of the OX-3 layer 48 is then conducted in a time mode by an anisotropic dry etching process which has high selectivity towards oxide but low selectivity towards the resist-1 layer 58. The dry etch process removes OX-3 layer 48 in the mask-2 layer 60 opened region 62 and stops at a predetermined depth by terminating the etch process after the pre-set time. The mask-2 layer 60 and the resist-1 layer 58 are then stripped and removed after the oxide-3 etch is completed.

In an alternate method to open region 62, the OX-3 layer 48 is etched in a time made directly without resist-1 layer 58 by an anisotropic dry etching process. Then the TEOS oxide is deposited and etched back to form the oxide spacer and keep the critic diameter of node contact openings 54.

Figure 6:
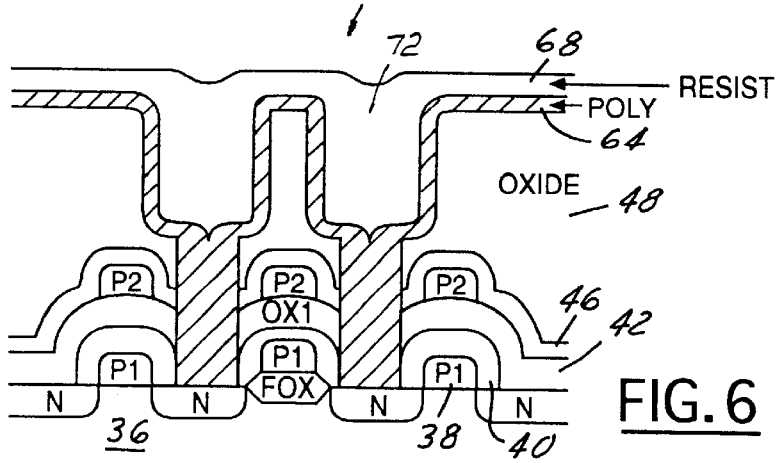
FIG. 6 is an enlarged, cross-sectional view of the present invention device of FIG. 5 having the resist layer removed and a polysilicon layer and an oxide layer sequentially deposited on top.

In the next fabrication step, as shown in FIG. 6, a polysilicon layer 64 (or poly-3) is deposited by a chemical vapor deposition technique (CVI)) where the in-situ doped polysilicon layer is deposited to contact the semi-conducting substrate 36 and the junctions contained therein through the node contact. The polysilicon layer 64 further covers all the surface 66 of the node tub 62. A resist-2 layer 68 is then deposited by a spin-on coating material which can be coated either as a thin layer of 1000 Å on the top/flat surface of structure 30 or as a thick layer 72 in the node tub opening 62.

Figure 7:
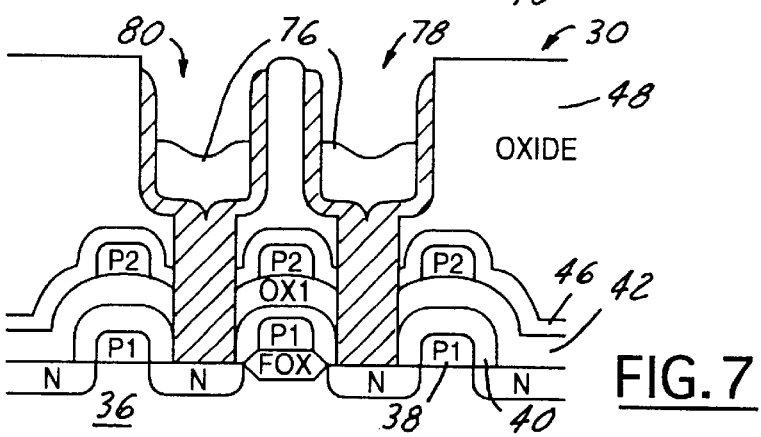
FIG. 7 is an enlarged, cross-sectional view of the present invention device of FIG. 6 having the oxide layer and the polysilicon layer partially removed.

The resist-2 layer can then be etched away in a dry etching process, as shown in FIG. 7, which removes the resist-2 layer 68, 72 above the top/flat surface and leaves enough thickness 76 in the node tub opening 62 to function as a mask for the polysilicon etch-back process that follows. After the poly etch-back process is completed, the poly-3 layer 64 is etched in an anisotropic dry etch process which removes poly-3 layer 64 that is on the flat top surface and forms separate storage nodes 78 and 80. The resist-2 layer 76 can then be removed after the poly-3 etch process. It should be noted that the resist-2 layer 76 can be replaced by an oxide layer (i.e., an OX-4 layer, not shown). The OX-4 layer of oxide can be suitably deposited of a BPSG material or a PE oxide material.

Figure 8:
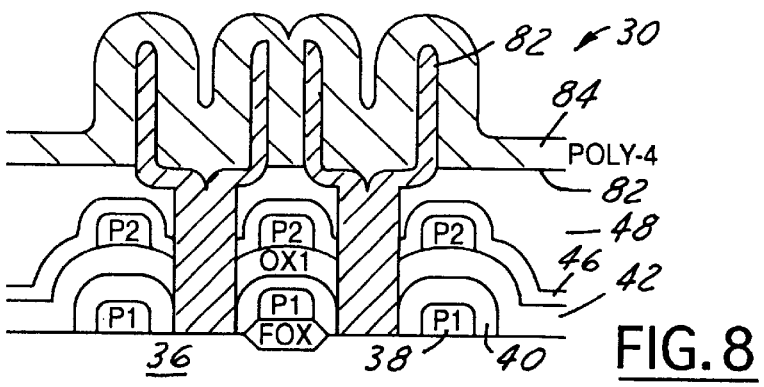
FIG. 8 is an enlarged, cross-sectional view of the present invention device of FIG. 7 having the residual oxide removed, a dielectric layer and a cell plate polysilicon layer deposited on top.

In the final processing stage, shown in FIG. 8, the OX-3 layer 48 and possibly the OX-4 layer 68 (or the resist-2 layer) are etched away in an anisotropic oxide etch process which removes a certain depth of the OX-3 layer 48 to expose the outside wall of the storage node. It should be noted that the OX-3 and the OX-4 layer can be removed at the same time by the same etching process in order to facilitate the present invention method.

A thin dielectric layer such as that of an oxide-nitride-oxide (ONO) composite film can be deposited as the capacitor dielectric. Other high dielectric constant material can also be suitably used as the dielectric layer sandwiched between the poly-3 layer 64 and the poly-4 layer 84. The poly-4 layer 84 can be deposited by a chemical vapor deposition method in which an in-situ doped polysilicon layer is deposited and formed as the cell plate for the DRAM capacitor.

In an alternate embodiment, the present invention novel process can be carried out by first depositing a thick oxide layer, and then opening a large node tub opening through partial thickness of the oxide layer, and then forming a node contact opening having a smaller diameter than the tub to make direct contact with the semi-conducting substrate material.

The present invention novel method of forming DRAM storage node by a simplified and improved process is thus fully demonstrated in a preferred embodiment and an alternate embodiment. The benefits made possible by the present invention novel method includes but not limited to the use of a single thick oxide layer deposition and a sequential node contact opening and node tub opening formation and a single polysilicon deposition to form the node contact and the crown-shaped storage node.

While the present invention has been described in an illustrative manner, it should be understood that the terminology used is intended to be in a nature of words of description rather than of limitation.

Furthermore, while the present invention has been described in terms of a preferred embodiment and an alternate embodiment, it is to be appreciated that those skilled in the art will readily apply these teachings to other possible variations of the inventions.

The embodiment of the invention in which an exclusive property or privilege is claimed are defined as follows:

1. A method for forming dynamic random access memory (DRAM) storage node comprising the steps of:

provide a pre-processed semiconductor wafer having an oxide layer deposited on top, said oxide layer having a thickness substantially the same as the height of the storage mode to be built, forming a node contact of a first diameter by a first mask and a first etching process to expose a semiconductor substrate, filling said node contact by a resist material or an anti-reflective coating material, etching said wafer by a chemical that has low selectivity towards oxide and high selectivity towards said resist or anti-reflective coating material to form a node tub of a second diameter by a second mask in a second etching process to a depth smaller than the thickness of the oxide layer, said second diameter being larger than said first diameter, and depositing and etching-back polysilicon and dielectric layers forming said storage node.

2. A method according to claim 1, wherein said pre-processed semiconductor wafer comprises CMOS devices built on source/drain junctions.

3. A method according to claim 1, wherein said method further comprises steps of forming a first polysilicon layer as word lines and forming a second polysilicon layer as bit lines isolated by an insulating layer.

4. A method according to claim 1, wherein said second diameter being at least twice of said first diameter.

5. A method according to claim 1, wherein said storage node forming step further comprising:
   depositing a conformal first polysilicon layer filling said node contact and covering said node tub,
   depositing a dielectric layer on top of said first polysilicon layer, and
   depositing a second polysilicon layer and forming cell plate.

6. A method according to claim 1, wherein said pre-processed semiconductor wafer having active regions, word lines, bit lines and inter-poly-oxide layers deposited on top.

7. A method according to claim 1, wherein said forming step for the node contact comprises a dry etching process.

8. A method according to claim 1, wherein said node tub forming step comprises an anisotropic dry etch process.

9. A method according to claim 1, wherein said polysilicon layers being deposited by an in-situ doped chemical vapor deposition process.

10. A method according to claim 5, wherein said first polysilicon layer makes electrical communication with the semiconductor substrate by filling said node contact.

11. A method of forming a storage node for a semiconductor structure comprising the steps of:
   providing a front-end processed semiconductor wafer having active regions, word lines and bit lines formed on top,
   depositing a first oxide layer to a thickness substantially the same as the height of the storage node to be built,
   forming a node tub of a first diameter by a first masking and a first etching process to a depth smaller than the thickness of said first oxide layer,
   forming a node contact of a second diameter by a second masking and a second etching process to expose a semiconductor substrate, said second diameter being smaller than said first diameter,
   depositing a first layer of polysilicon filling said node contact and covering a surface of said node tub,
   depositing a second oxide layer filling said node tub,
   removing said first and said second oxide layer to expose an outside wall of said node tub, and
   depositing sequentially a dielectric layer and a second polysilicon layer forming a crown-shaped storage node.

12. A method according to claim 11, wherein said second diameter is less than half of said first diameter.

13. A method according to claim 11, wherein said first oxide layer being deposited of a BPSG material or a PE oxide material.

* * * * *